United States Patent
Matsutori et al.

(10) Patent No.: US 7,259,835 B2
(45) Date of Patent: Aug. 21, 2007

(54) RETICLE-PROCESSING SYSTEM (75) Inventors: Chiaki Matsutori, Kikuchi (JP); Koichi Yanagihara, Kikuchi (JP)

(73) Assignee: Miraial Co., Ltd. (JP)

( * ) Notice: Subject to any disclaimer, the term of this patent is extended or adjusted under 35 U.S.C. 154(b) by 0 days.

(21) Appl. No.: 11/293,083

(22) Filed: Dec. 5, 2005

(65) Prior Publication Data

US 2006/0126042 A1    Jun. 15, 2006

(30) Foreign Application Priority Data

Dec. 14, 2004    (JP)    ............................... 2004-361901

(51) Int. Cl.
*G03B 27/62* (2006.01)
*G03B 27/58* (2006.01)

(52) U.S. Cl. .......................................... 355/75; 355/72
(58) Field of Classification Search .................. 355/53, 355/72–76; 414/226.05; 250/548
See application file for complete search history.

(56) References Cited

U.S. PATENT DOCUMENTS

| | | | |
|---|---|---|---|
| 4,999,671 A * | 3/1991 | Iizuka | 355/97 |
| 5,442,163 A * | 8/1995 | Nakahara et al. | 235/381 |
| 5,972,727 A | 10/1999 | Ryan et al. | 438/14 |
| 6,930,762 B2 * | 8/2005 | Yamada | 355/75 |
| 2002/0024647 A1 * | 2/2002 | Nakahara et al. | 355/53 |
| 2004/0185682 A1 | 9/2004 | Foulke et al. | 438/800 |

FOREIGN PATENT DOCUMENTS

| | | |
|---|---|---|
| EP | 0 846 983 | 6/1998 |
| EP | 1 022 615 | 7/2000 |
| EP | 1 662 324 | 5/2006 |
| JP | A-10-163094 | 6/1998 |

* cited by examiner

*Primary Examiner*—Henry Hung Nguyen
(74) *Attorney, Agent, or Firm*—Bacon & Thomas, PLLC (57) ABSTRACT

A reticle-processing system includes a reticle-carrying container, a transfer rail for transferring the reticle-carrying container, a light exposure apparatus for printing a circuit pattern, and a reticle stocker for keeping a plurality of reticles. Orientation changer detects the orientation of the reticle-carrying container and changes it appropriately and is located in a path from the reticle stocker to a printing position in the light exposure apparatus. The orientation changer includes a rotary drive for rotating the reticle-carrying container, an orientation detector 83 for detecting the orientation of the reticle-carrying container, which is provided in the path from the reticle stocker to the printing position in the light exposure apparatus, and a controller for, when the orientation detected by the orientation detector is shifted by 180 degrees, controlling the rotary drive so as to correct the orientation.

6 Claims, 6 Drawing Sheets

RETICLE-PROCESSING SYSTEM

CROSS-REFERENCE TO RELATED APPLICATION

This application claims, under 35 USC 119, priority of Japanese Application No. 2004-361901 filed on Dec. 14, 2004.

BACKGROUND OF THE INVENTION

1. Field of the Invention

The present invention relates to a reticle-processing system in which transfer means transfers a reticle-carrying container storing a reticle from a reticle stocker to a light exposure apparatus and the light exposure apparatus prints a circuit pattern onto a substrate through the use of the reticle.

2. Description of the Background Art

Semiconductor devices and liquid crystal display devices are manufactured in the process of photolithography. In this process, an image of pattern formed on the reticle (including a photo mask) is projected and transferred by a light exposure apparatus onto a substrate such as a semiconductor wafer and a glass plate.

At that time, the projected pattern reacts with a photo-sensitive agent applied to the substrate, and then a circuit is formed through the subsequent operations.

During this process, the reticle is handled to be stored in a dedicated reticle-carrying container in order to prevent contamination with dust, etc. and damage from contact with other components.

For making an intricate circuit, it is necessary to provide a large number of circuit patterns on the substrate. Accordingly, many reticles are prepared and many patterns are exposed in layers on the substrate.

Figure 2:
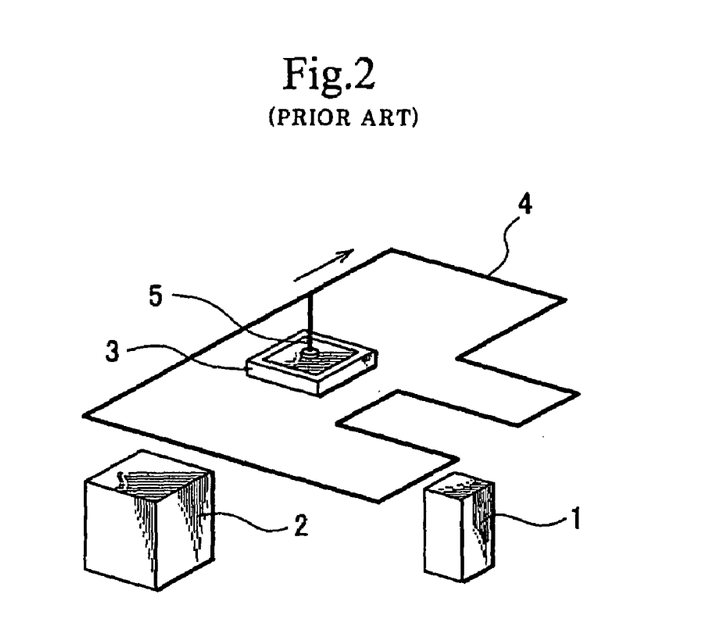
FIG. 2 is an outline structural view showing one example of an apparatus used in the photolithography process.

FIG. 2 shows one example of a reticle-processing system used in the photolithography process. In the figure, a numeral number 1 indicates a light exposure apparatus that projects and transfers a circuit pattern onto the substrate. A numeral number 2 denotes a reticle stocker in which a large number of reticles are stored and retained. A numeral number 3 shows a reticle-carrying container which stores reticles. A numeral number 4 indicates a transfer rail provided between the light exposure apparatus 1 and the reticle stocker 2, which transfers the reticles stored in the reticle-carrying container 3 between these two components. A numeral number 5 shows a transfer mechanism provided on the transfer rail 4, which holds and transfers directly the reticle-carrying container 3.

These components are controlled by a controller (not shown). With this, the reticles required for a circuit pattern stored in the reticle-carrying container 3 are transferred on the transfer rail 4 by the transfer mechanism 5 from the reticle stocker 2 to the light exposure apparatus 1. The reticles no longer required in the light exposure apparatus 1 are returned to the reticle stocker 2 by the transfer mechanism 5 on the transfer rail 4.

If the reticles used in the above described process are contaminated with dust, etc. or damaged by contact with other components, it is impossible to form an accurate circuit pattern. Therefore, for supporting the reticles safely and securely, they are stored in the reticle-carrying containers 3. The reticle-carrying container 3 is transferred in a state that its orientation is accurately controlled in relation to the circuit pattern printed onto the substrate through light exposure. Such operations as the transfer of the reticle-carrying container 3 and light exposure by means of the reticle are carried out by the reticle-processing system.

One example of the reticle-processing system is shown in Japanese Patent Laid-open No. 10-163094. According to Japanese Patent Laid-open No. 10-163094, a reticle case alignment device is provided so as to perform light exposure with alignment of a reticle case.

Under the above mentioned conventional reticle-processing system, if the operator tries to set the reticle-carrying container 3 from outside in wrong orientation into the reticle-processing system, the setting of the reticle-carrying container 3 is disabled or the operation of the alignment device is stopped. That is, generally, the reticle-carrying container 3 can be set in the system only when the reticle-carrying container 3 is placed in the proper orientation by means of the kinematic pin grooves provided to the reticle-carrying container 3 and the kinematic pins provided to the light exposure apparatus. In addition, even if the reticle-carrying container 3 is set in wrong orientation in the system, the alignment device detects the misplacement and comes to a stop. After the stop, some measure is taken, such as changing the orientation of the reticle-carrying container 3.

In these cases, however, there is a problem of impartment of working efficiency. More specifically, if the reticle-carrying container 3 cannot be set into the system when it is wrongly oriented, the operator is required to exercise due care in placing the reticle-carrying container 3 in the system, which brings inefficiencies to his/her work. Moreover, in the case of the misplacement of the reticle-carrying container 3, the system is suspended all the while the alignment device comes to a stop and the reticle-carrying container 3 is re-oriented, resulting in the decreased efficiency of light exposure operation.

SUMMARY OF THE INVENTION

In order to solve the above stated problems, the present invention makes it possible to allow the wrong orientation of a reticle-carrying container and correct the wrong orientation automatically. More specifically, the present invention has at least a reticle-carrying container for storing the reticle, transfer means for transferring the reticle-carrying container, a light exposure apparatus for printing a circuit pattern onto a photoresist on a semiconductor wafer through a use of the reticle, and a reticle stocker for keeping a plurality of the reticles, and includes means for detecting an orientation of the reticle-carrying container and changing the reticle-carrying container so as to be appropriately oriented, in at least one place in a path from the reticle stocker to the printing position in the light exposure apparatus.

Accordingly, while the reticle-carrying container moves from the reticle stocker to the printing position in the light exposure apparatus, the means for changing appropriately the orientation of the reticle-carrying container detects the orientation of the reticle-carrying container and corrects it appropriately.

Preferably, the means for changing appropriately the orientation of the reticle-carrying container includes a rotation drive part for rotating the reticle-carrying container, orientation detection means for detecting the orientation of the reticle-carrying container, which is provided in some place in the path from the reticle stocker to the printing position in the light exposure apparatus, and a control part for determining whether the orientation detected by the orientation detection means is proper or not and, when the orientation is shifted by 180 degrees, controlling the rotation drive part so as to rotate the reticle-carrying container for the proper orientation.

Accordingly, when having determined that the orientation detected by the orientation detection means is shifted by 180 degrees, the control part controls the rotation drive part so as to rotate the reticle-carrying container for the proper orientation.

Preferably, the orientation detection means includes a wireless tag for detecting the orientation of the reticle-carrying container in a non-contact manner.

This makes it possible to, during the transfer of the reticle-carrying container, detect the orientation of the reticle-carrying container without stopping the transfer and in a non-contact manner. When having determined that the orientation detected by the orientation detection means is shifted by 180 degrees, the control part controls the rotation drive part so as to rotate the reticle-carrying container for the proper orientation.

In addition, the orientation detection means may include an optical sensor for detecting the orientation of the reticle-carrying container in a non-contact manner.

This makes it possible to, during the transfer of the reticle-carrying container, detect the orientation of the reticle-carrying container without stopping the transfer and in a non-contact manner, as in the case of the wireless tag. If having determined that the orientation detected by the orientation detection means is shifted by 180 degrees, the control part controls the rotation drive part so as to rotate the reticle-carrying container for the proper orientation.

Preferably, the means for changing appropriately the orientation of the reticle-carrying container may be provided in the transfer means or the light exposure apparatus.

This makes it possible to determine whether the orientation of the reticle-carrying container is proper or not. If not proper, it is corrected while the reticle-carrying container is stored in the transfer means or while it is stored in the light exposure apparatus.

Preferably, two pairs of kinematic pin grooves for positioning and fastening the reticle-carrying container in the light exposure apparatus are formed with a 180-degree turn from each other on an outer surface of a door of the reticle-carrying container.

This allows the reticle-carrying container to be fastened as it is into the reticle stocker even if the reticle-carrying container is wrongly oriented, which eliminates the need to be excessively careful about the orientation of the reticle-carrying container.

It is preferable to arrange receiving parts for receiving and holding the kinematic pin grooves in the positions corresponding to the kinematic pin grooves on the outer surface of a pod of the reticle-carrying container, so that the two pairs of kinematic pin grooves can be engaged in the both orientations.

This makes it possible to stack a plurality of reticle-carrying containers without paying excessive attention to their orientations.

DESCRIPTION OF THE PREFERRED EMBODIMENTS

Figure 1:
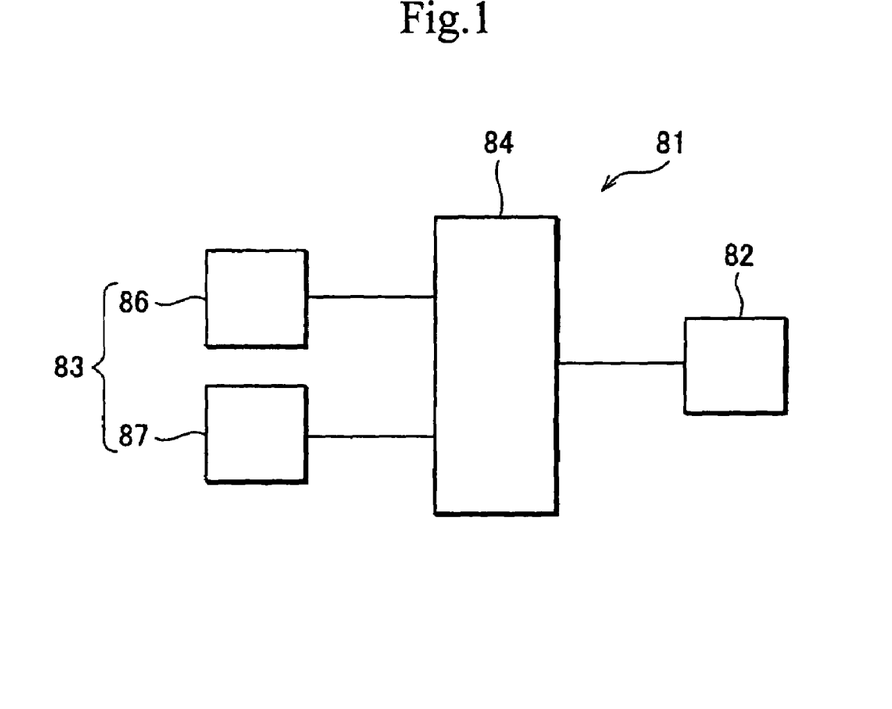
FIG. 1 is a functional block diagram showing means for changing the orientation of a reticle-carrying container according to an embodiment of the present invention.
Figure 3A:
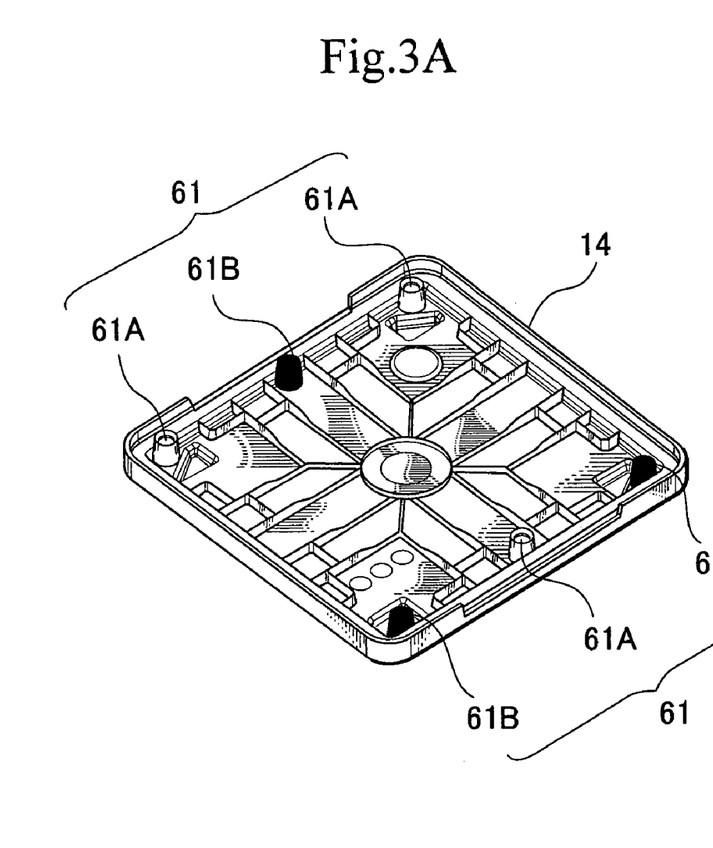
FIG. 3 is a perspective view of a door according to the embodiment of the present invention as seen from its bottom.
Figure 3B:
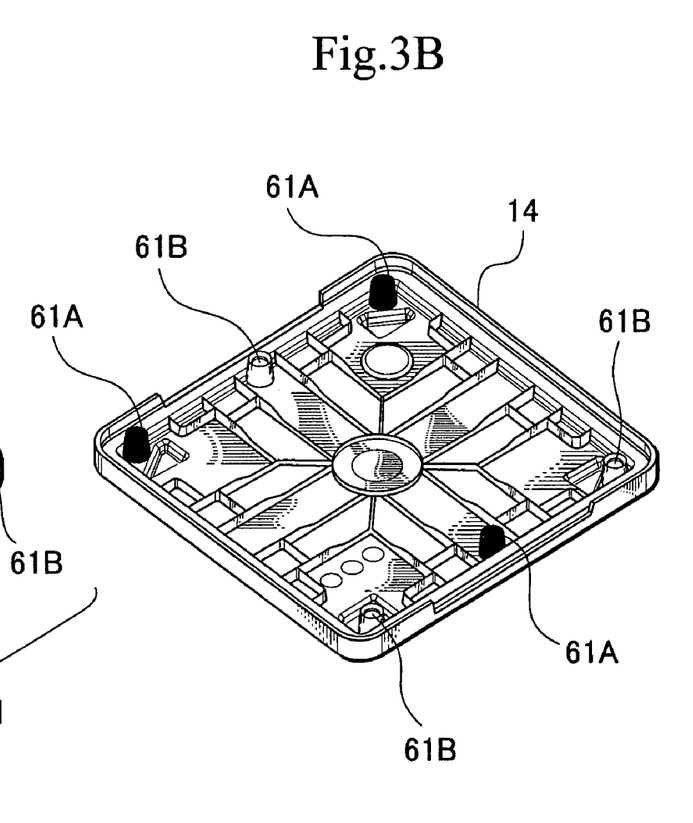
Figure 6:
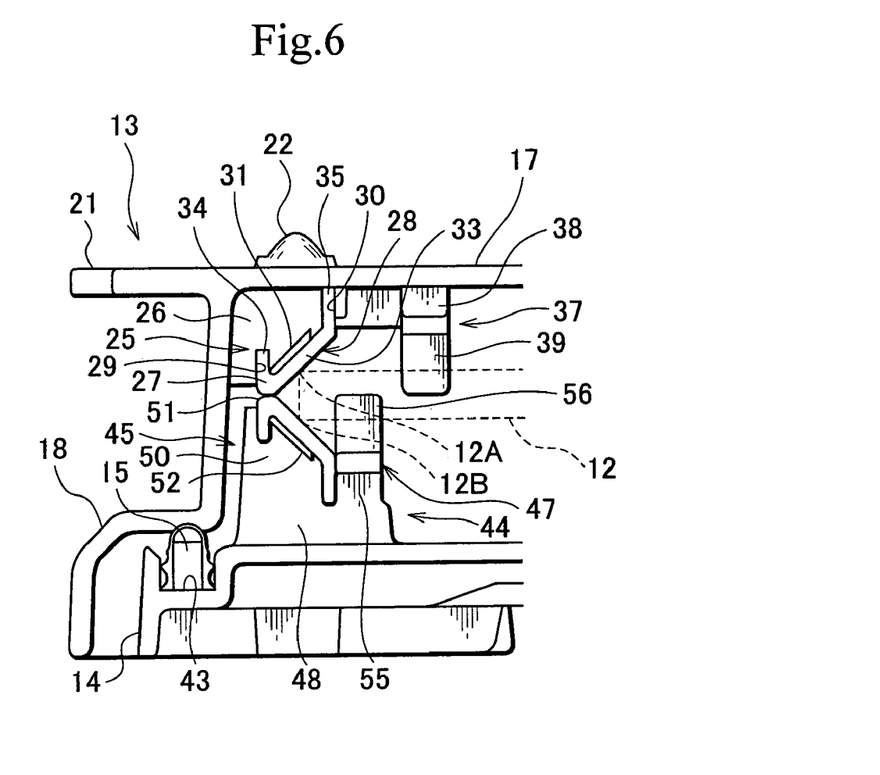
FIG. 6 is a cross sectional view showing major components of the reticle-carrying container according to the embodiment of the present invention.
Figure 7:
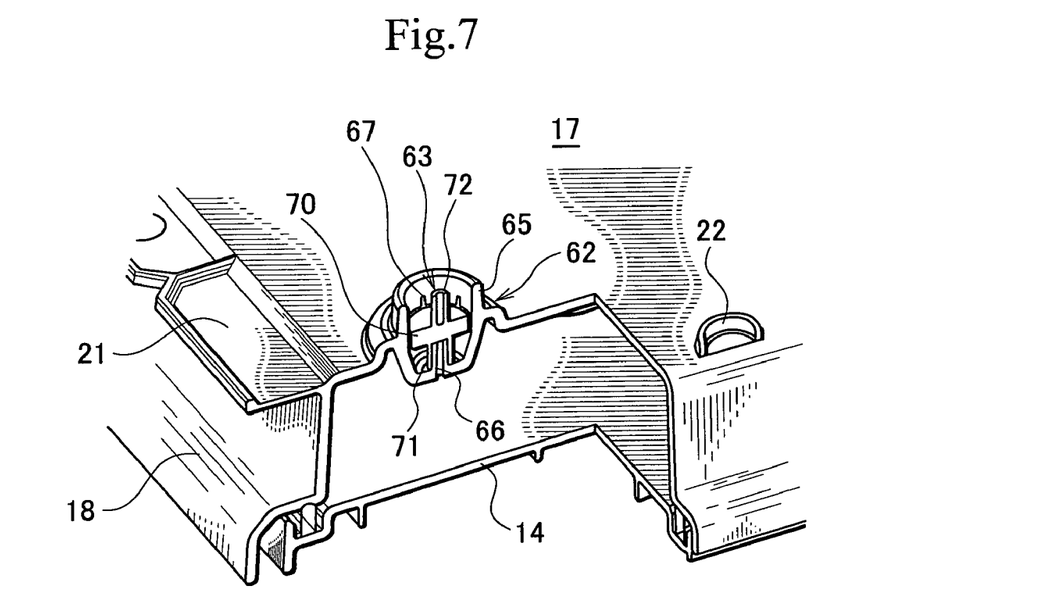
FIG. 7 is a cross sectional view of the major components of a membrane filter according to the embodiment of the present invention.
Figure 8:
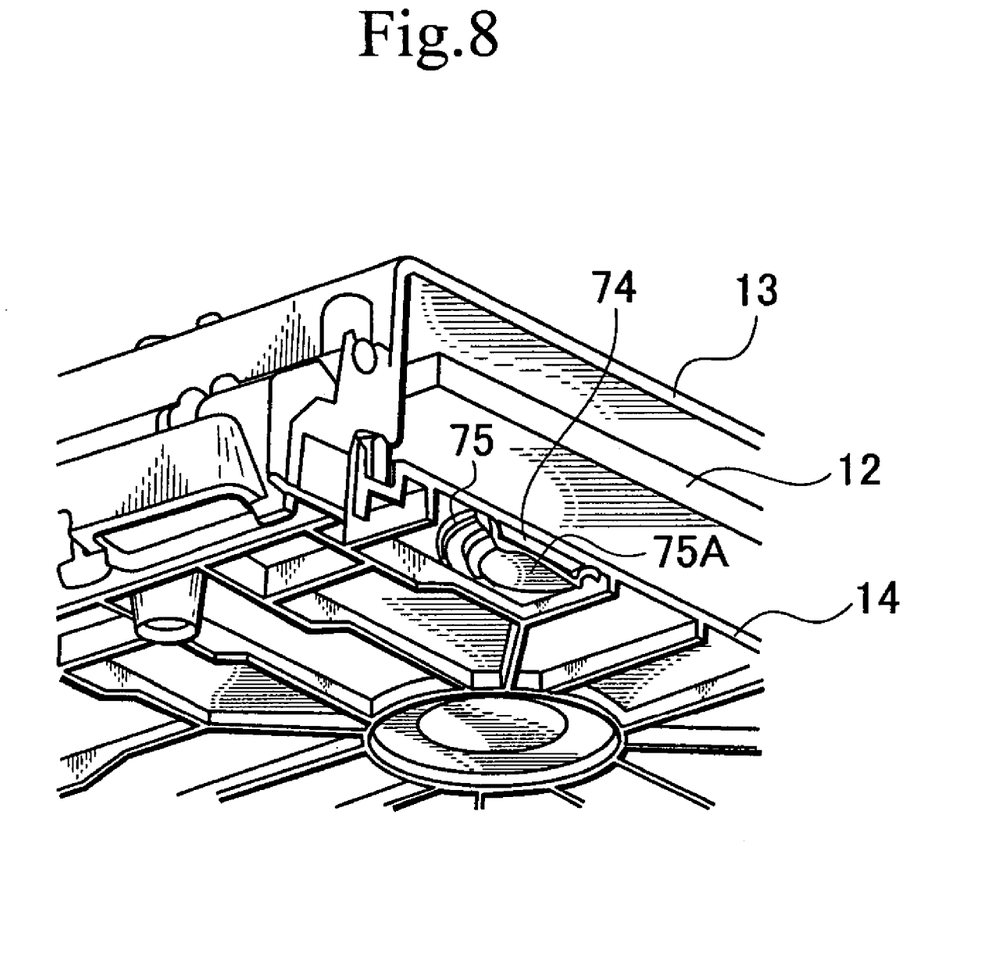
FIG. 8 is a cross sectional view of the major components of a wireless tag according to the embodiment of the present invention.

The embodiment of the present invention is described below with reference of the accompanied drawings. FIG. 1 is a functional block diagram showing means for changing the orientation of a reticle-carrying container, FIG. 3 is a perspective view of the door as seen from its bottom, FIG. 4 is a perspective view showing the reticle-carrying container according to the embodiment of the present invention in which a pod and the door are separated from each other, FIG. 5 is a side cross sectional view showing the reticle-carrying container according to the embodiment of the present invention, FIG. 6 is a cross sectional view showing the major components of the reticle-carrying container according to the embodiment of the present invention, FIG. 7 is a cross sectional view of the major components of a membrane filter, and FIG. 8 is a cross sectional view of the major components of a wireless tag.

Figure 4:
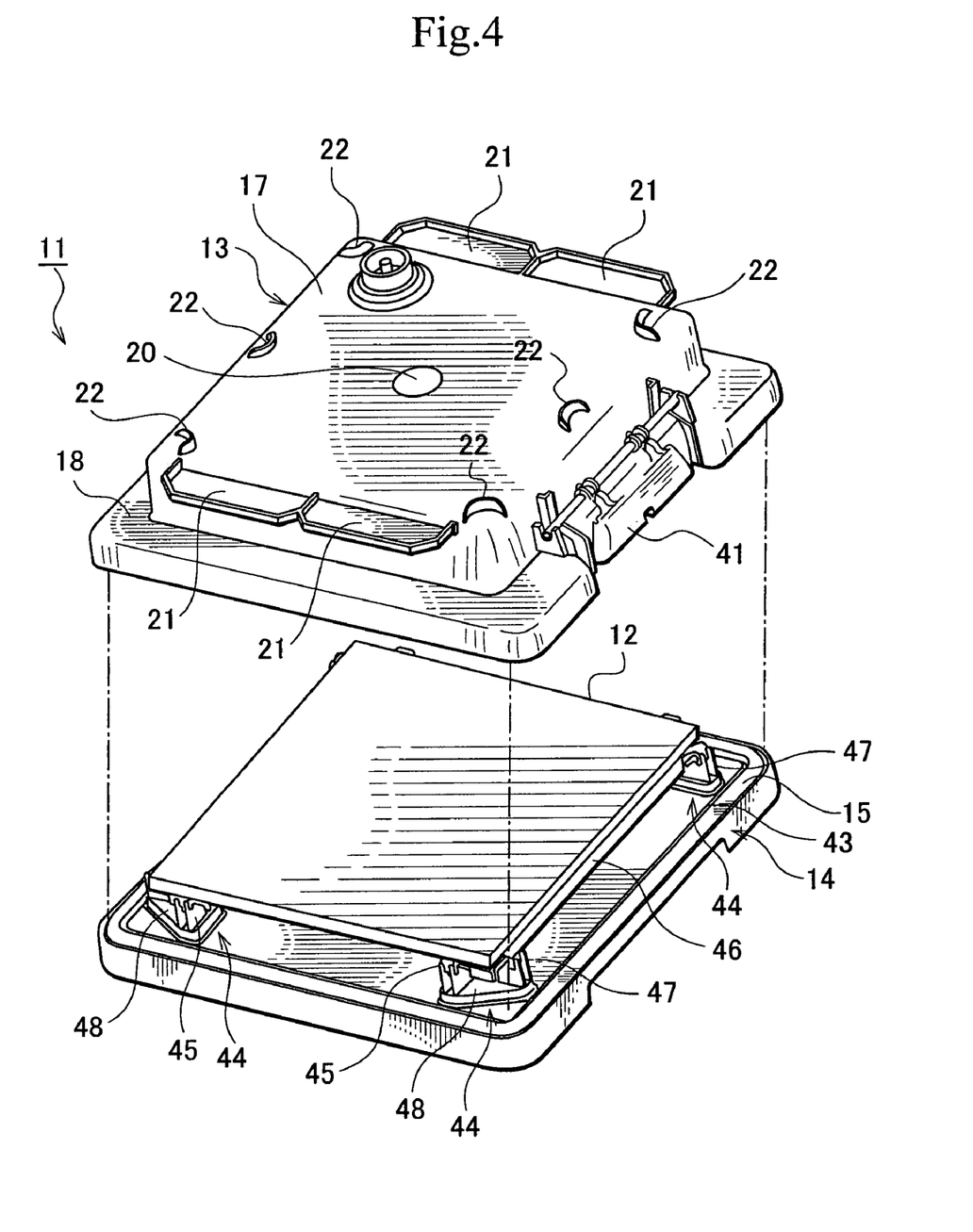
FIG. 4 is a perspective view showing the reticle-carrying container according to the embodiment of the present invention in which the pod and the door are separated from each other.
Figure 5:
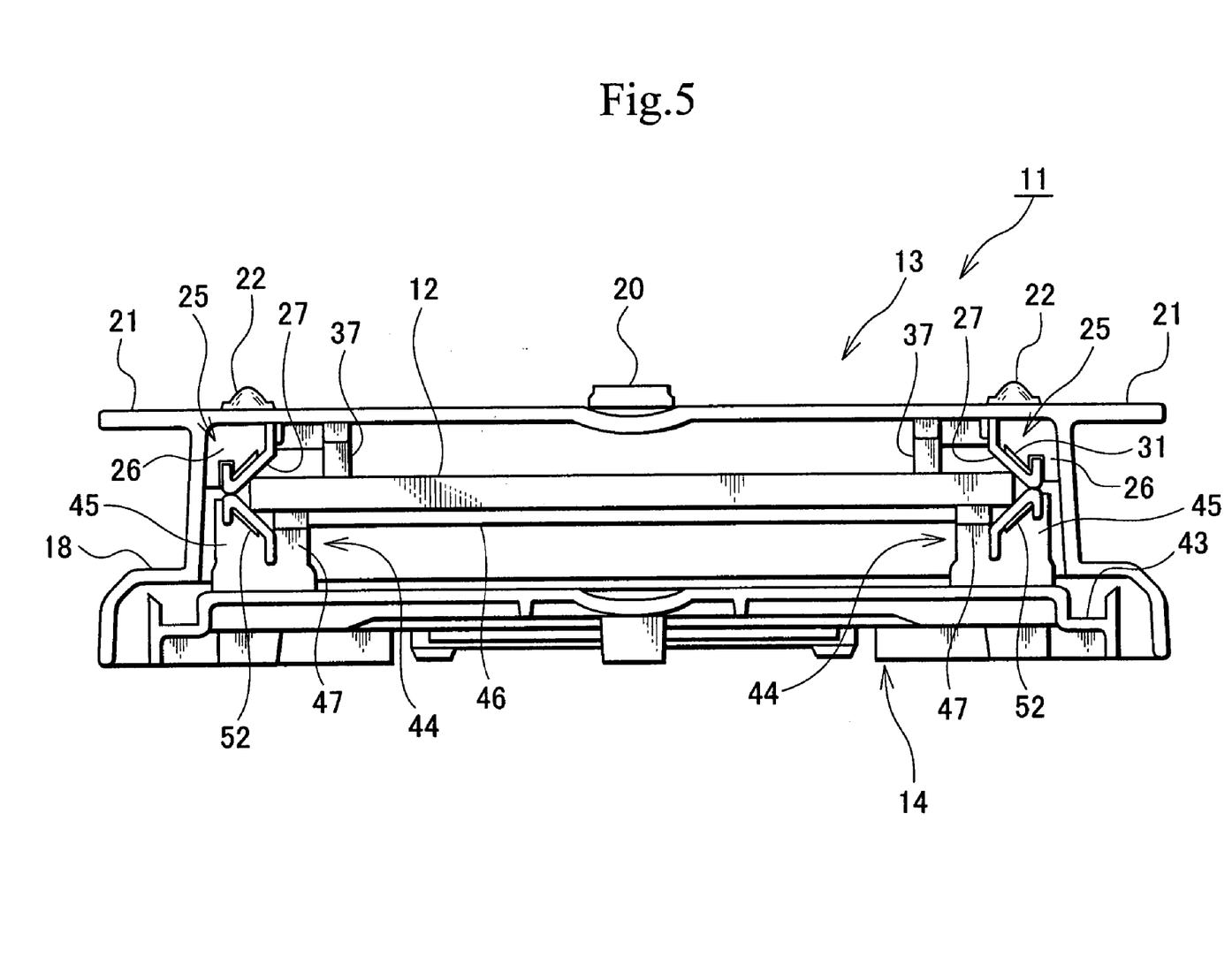
FIG. 5 is a side cross sectional view showing the reticle-carrying container according to the embodiment of the present invention.

As shown in FIGS. 4 and 5, a reticle-carrying container 11 is mainly composed of a pod 13 for storing a reticle 12, a door 14 for blocking the pod 13, and a seal material 15 provided between the pod 13 and the door 14, for sealing the interior hermetically.

The pod 13 is composed of a main part 17 for storing the reticle 12 in the interior and a peripheral edge engagement part 18 that is formed integrally with the outer edge of the main part 17 and engages with the door 14.

The main part 17 is formed in the shape of a dish and configured to have a depth at which the reticle 12 is completely stored in the interior. A center handling flange 20 for reticle transfer is provided in the center of the main part 17. A horizontally extending plate-shaped side handling flange 21 is provided to the peripheral edge of the main part 17. The center handling flange 20 is coupled with the arm (not shown) of the transfer mechanism to lift the reticle-carrying container 11 and the pod 13. In addition, the side handling flange 21 is used as auxiliary supporting means in separating the door 14 mechanically from the pod 13 within the light exposure apparatus. Moreover, provided on the peripheral edge of the outer surface of the main part 17 are receiving parts 22 of kinematic pin grooves 61 described later, three each on one side and total six on the two opposed sides. The six receiving parts 22 are arranged in the positions corresponding to the kinematic pin grooves 61 so that the two pairs of kinematic pin grooves 61 can be engaged with the pins in the both orientations. Each of the receiving parts 22 is formed of a plate with a semicircular flat plane. Also, each of the receiving parts 22 with a semicircular flat plane is arranged so as to face its opening outward. In addition, the receiving parts 22 with a semicircular flat plane are formed with a slight inward inclination in such a manner that their front ends become closer to one another than their base ends. This allows the upper kinematic pin grooves 61 of the reticle-carrying container 11 to engage easily with the lower receiving parts 22 of the reticle-carrying container 11, thereby positioning the reticle-carrying container 11 accurately. Therefore, it is possible to stack a plurality of reticle-carrying containers 11 in an easy and stable manner.

Reticle retainers 25 are provided in the vicinities of the four corners inside the main part 17. The reticle retainer 25 is a member for supporting the reticle 12 in a pair with a reticle retainer 45 described later on the door 14. As shown in FIGS. 5 and 6, the reticle retainer 25 is composed of a retainer receiving part 26 and a retainer plate 27. The retainer receiving part 26 is a member for supporting the retainer plate 27. The retainer receiving parts 26 are formed integrally with the main part 17 in the vicinities of the four corners inside the main part 17. More specifically, the retainer receiving part 26 is made of a pentagonal plate material formed on a corner of the main part 17, and one of the sides of the plate material constitutes an inclined plane 28 that contacts with an upper corner 12A of the reticle 12 and supports the reticle elastically. One end of the side of the retainer receiving part 26 that forms the inclined plane 28 is provided with a one-end engagement notch 29 that engages with one end of the retainer plane 27. The other end of the side of the retainer receiving part 26 that forms the inclined plane 28 is provided with an other-end engagement notch 30 that engages with the other end of the retainer plate 27. Besides, a concave portion 31 is provided on the side forming the inclined plane 28. The concave portion 31 is a part that is provided inside the inclined plane 28 and allows the deformation of the inclined plane 28 at the time of contact with the upper corner 12A of the reticle 12. The concave portion 31 provides the retainer plate 27 with a shock-absorbing function. That is, the retainer plate 27 becomes elastically deformed with the elasticity of the retainer plate 27 itself and also by the action of the concave portion 31, absorbs the vibrations, etc. from outside and supports the reticle 12 elastically. A gap of about 1 mm between the concave portion 31 and the retainer plate 27 is acceptable.

The retainer plate 27 is a member that forms the inclined plane 28 for contacting with the upper corner 12A of the reticle 12 and supporting the reticle 12 elastically. The retainer plate 27 is molded of elastic macro molecule material. To be more specific, the retainer plate 27 is made of elastic material generating no dust, such as PEE (polyester elastomer), PBT (polybutylene terephthalate) and PP (polyproplylene). The retainer plate 27 is composed of a contact surface plate 33, a one-end engagement part 34 and an other-end engagement part 35, and its side is formed in an irregular U shape. The contact surface plate 33 is a member for constituting the inclined plane 28 with the retainer plate 27 engaged with the retainer receiving part 26. The contact surface plate 33 is molded of elastic synthetic resin, and thus is elastically deformed by its own and also is elastically bent by the action of the above mentioned concave portion 31. This allows the contact surface plate 33 to contact the upper corner 12A of the reticle 12 obliquely and support the reticle 12 elastically.

The one-end engagement part 34 is a member that engages with the one-end engagement notch 29 of the retainer receiving part 26 to attach the retainer plate 27 to the retainer receiving part 26. The other-end engagement part 35 is a part that engages with the other-end engagement notch 30 of the retainer receiving part 26 to attach the retainer plate 27 to the retainer receiving part 26. Accordingly, the one-end engagement part 34 and the other-end engagement part 35 engage with the one-end engagement notch 29 and the other-end engagement notch 30, respectively, which allows the retainer plate 27 to be fixed to the retainer receiving part 26.

In addition to the reticle retainers 25, pellicle retainers 37 are provided to the vicinities of the four corners inside the main part 17. The reticle 12 may be not provided with the pellicle, may be provided with the pellicle 46 on its bottom, or may be provided with the pellicle 46 on its both top and bottom. The pellicle retainer 37 is a member that works with the pellicle provided on the top of the reticle 12. The pellicle retainer 37 has the same structure as that of the reticle retainer 25. More specifically, the pellicle retainer 37 is composed of a retainer receiving part 38 having the same structure as that of the retainer receiving part 26 of the reticle retainer 25 and a retainer plate 39 having the same structure as that of the retainer plate 27 of the reticle retainer 25. A concave portion (not shown) having the same structure as that of the concave portion 31 of the reticle retainer 25 is provided inside the retainer plate 39.

As shown in FIGS. 4 and 5, the peripheral edge engagement part 18 of the pod 13 is formed in the shape of a dish in such a manner as to protrude circumferentially from the peripheral edge of the main part 17. The dish-shaped edge engagement part 18 is configured to have a depth at which the door 14 is completely stored in its interior. The opposed sides of the peripheral edge engagement part 18 are provided with fasteners 41 for holding down the door 14.

The door 14 is a member that engages with the peripheral edge engagement part 18 of the pod 13 to block the pod 13 and seal the interior hermetically via the seal material 15. As shown in FIG. 4 to FIG. 6, the door 14 is formed in the approximately flat shape and provided with a seal groove 43 on its peripheral edge. The seal material 15 is attached to the seal groove 43 so as to hermetically seal the gap between the pod 13 and the door 14. Door-side support members 44 are provided to the four corners on the top of the door 14. The door-side supporting member 44 is composed of a reticle retainer 45 for supporting the reticle from the both top and bottom in coordination with the reticle retainer 25 on the side of the pod 13, a pellicle retainer 47 for supporting the pellicle 46 attached to the bottom of the reticle 12, and a base plate 48 for supporting the above mentioned components integrally. The reticle retainer 45 is structured in such a manner that a retainer receiving part 50 is shifted in a direction perpendicular to the plane of FIG. 6 from the retainer receiving part 27 of the reticle retainer 25 on the side of the pod 13, thereby displaying mirror symmetry. To be more specific, the reticle retainer 45 is composed of the retainer receiving part 50 and a retainer plate 51, and these components are configured so as to be mirror symmetrical with respect to the retainer receiving part 26 and the retainer plate 27 of the reticle retainer 25, respectively. A concave portion 52 inside the retainer plate 51 also has the same functions as those of the concave portion 31 of the reticle retainer 25. More specifically, the retainer plate 51 is elastically bent by the action of the concave portion 52 so as to contact the lower corner 12B of the reticle 12 obliquely and support elastically the reticle 12.

The above mentioned reticle retainer 45 and the reticle retainer 25 are located so as to shift from each other and support the reticle 12 without interference with each other. The reticle 12 is held and supported in a predetermined position between these reticle retainers 25 and 45. Even if the pod 13 is removed, the reticle 12 is continuously supported by the reticle retainer 45 of the door 14, at a predetermined distance from the door 14. A pellicle receiving part 56 of the pellicle retainer 47 is shifted in a direction transverse with respect to the plane of FIG. 6 from the retainer receiving part 39 of the pellicle retainer 37 on the side of the pod 13, thereby displaying mirror symmetry. More specifically, the pellicle retainer 47 is composed of a retainer receiving part 55 that is mirror symmetrical with the retainer receiving part 38 of the pellicle retainer 37 on the pod 13 and a retainer plate 56 that is mirror symmetrical with the retainer plate 39. A concave portion (not shown) having the same structure as that of the concave portion of the pellicle retainer 37 is provided inside the retainer plate 56.

As shown in FIG. 3, two pairs of kinematic pin grooves 61 are arranged on the back of the door 14. The kinematic pin groove 61 is a member for positioning and attaching the door 14 to the light exposure apparatus. The total six kinematic pin grooves 61, three each at the apexes of an approximately isosceles triangle, are provided in two pairs (61A and 61B) with a 180-degree turn from each other. This is because, even if the operator has attached the reticle-carrying container 11 to the light exposure apparatus in a 180-degree-turned orientation by mistake, these pin grooves allow the reticle-carrying container 11 to be fit into the apparatus.

As illustrated in FIG. 7, a membrane filter attachment part 62 is formed in the pod 13. The membrane filter attachment part 62 is a part for allowing the membrane filter 63 to be securely attached and easily removed. The membrane filter attachment part 62 is composed of a tube guide 65, a filter engagement pipe 66 and a stopper 67.

The tube guide 65 is a part for storing and fixing the membrane filter 63 in the interior. The tube guide 65 is arranged integrally with the main part 17 of the pod 13. The outside of the tube guide 65 has an opening through which the membrane filter 63 is attached or removed. Moreover, the tube guide 65 also works as a tube for connection with a gas supply tube (not shown) for changing gases in the reticle-carrying container 11. The inside of the tube guide 65 is covered and provided with the filter engagement pipe 66. The filter engagement pipe 66 is a part for engagement with an engagement pipe 71 of the membrane filter 63. The filter engagement pipe 66 is structured in the tube guide 65, as a small-diameter pipe extruding outward from the inside bottom of the tube guide 65. The stopper 67 is provided in the center of the inside surface of the tube guide 65. The stopper 67 is a member for fixing the membrane filter 63 attached to the tube guide 65 so as not to fall off the tube guide 65.

The membrane filter 63 is a filter that allows the passage of a gas between the inside and outside of the reticle-carrying container 11. The membrane filter 63 prevents the entry of dust, etc. and allows only a gas to pass between the inside and outside of the reticle-carrying container 11. The membrane filter 63 is composed of a filter main part 70, an engagement pipe 71 and an opening pipe 72.

The filter main part 70 is formed in the shape of a thick-walled disc and stores a filter in its interior. The filter main part 70 has a diameter so as to be locked on the stopper 67. The engagement pipe 71 is a member for making inside of the filter main part 70 communicate with inside of the reticle-carrying container 11. When the membrane filter 63 is attached to the tube guide 65, the engagement pipe 71 engages with the filter engagement pipe 66, thereby making the filter main part 70 communicate with the inside of the reticle-carrying container 11. The opening pipe 72 is a part for making the inside of the reticle-carrying container 11 communicate with outside via a filter. As such a filter, a 0.1- to 0.5-$\mu$m mesh is fitted so as to eliminate inert gases and dust elements in dry air.

As illustrated in FIG. 8, a wireless tag 74 is provided to the outer surface of the door 14. The wireless tag 74 is covered with a covering plate 75 and attached to the outer surface of the door 14. When covering the wireless tag 74 completely, the covering plate 75 is welded at its circumference and thus the interior is sealed. A concave portion 75A for storing the wireless tag 74 is formed in the covering plate 75. When the wireless tag 74 is stored in the concave portion 75A of the covering plate 75, the covering plate 75 is welded at its circumference to the outer surface of the door 14. This allows the wireless tag 74 to be hermetically stored in the covering plate 75. The purpose for that is to prevent the wireless tag 74 from falling off or suffering mechanical damage during transport of the reticle-carrying container 11. In addition, there is also the purpose of avoiding contamination of the light exposure apparatus with the wireless tag itself. The wireless tag 74 is a component that includes a coiled antenna (not shown) and an IC chip (not shown), generates an induced electromotive force in the antenna with the change of an electromagnetic wave from outside, and writes information into the IC chip in a non-contact manner or reads recorded information from the IC chip through the use of the changes in the electromotive force. The wireless tag 74 holds various types of management information required for operations and storage. Besides, the wireless tag 74 may function as orientation detection means described later. Besides, the wireless tag 74 may be provided on the side of the pod 13.

The reticle-processing system for printing a circuit pattern onto the substrate of the semiconductor wafer, etc. with the use of the reticle-carrying container 11 is structured as follows. The overall structure of the reticle-processing system is partly common with the conventional reticle-processing system shown in FIG. 2. Therefore, the descriptions of the identical components are omitted here, with the same reference numerals given to the components. The reticle-processing system is mainly composed of the reticle-carrying container 11 for storing the reticle 12, transfer means (4, 5) for transferring the reticle-carrying container 11, the light exposure apparatus 1 for printing a circuit pattern onto a resist on the semiconductor wafer (not shown) with the use of the reticle 12, the reticle stocker 2 for keeping the plurality of reticles 12, and orientation change means 81 for changing appropriately the orientation of the reticle-carrying container (see FIG. 1).

The transfer means (4, 5) is means connected with a center handling flange 20 of the reticle-carrying container 11 to transfer the reticle-carrying container 11 from the reticle stocker 2 to the light exposure apparatus 1 for circuit pattern printing and also transfer the reticle-carrying container 11 after the circuit pattern printing back to the original position in the reticle stocker 2. The transfer means (4, 5) may take various forms, and is here formed from the transfer rail 4 and the transfer mechanism part 5. The transfer means may employ a belt conveyor or self-propelled device in addition to using a rail.

The transfer mechanism part 5 is provided with an arm part (not shown) to be connected with the center handling flange 20 of the reticle-carrying container 11. This allows the arm part of the transfer mechanism 5 to connect to the center handling flange 20 and lift the reticle-carrying container 11. The arm part is provided with a rotation drive part 82 of the orientation change means 81 described below.

The orientation change means 81 is means for correcting appropriately the orientation of the reticle-carrying container 11. More specifically, this is means that detects whether the orientation of the reticle-carrying container 11 is correct or not, and leaves the reticle-carrying container 11 as it is if the orientation is correct, and changes appropriately the orientation of the reticle-carrying container 11 if the orientation is wrong. The orientation change means 81 is provided to at least one place in the path from the reticle stocker 2 to the printing position in the light exposure apparatus 1. This is for the purpose of correcting the orientation of the reticle 12 to be transferred from the reticle stocker 2 to the printing position in the light exposure apparatus 1 before the setting of the reticle 12 in the printing position. Since there is no problem as long as the orientation of the reticle 12 can be corrected in the path from the reticle stocker 2 to the printing position in the light exposure apparatus 1, the orientation change means 81 may be provided to at least one place in the path from the reticle stocker 2 to the light exposure apparatus 1. The orientation change means 81 may be arranged in a plurality of places so as to check the orientation of the reticle-carrying container 11 in the plurality of places. For example, the orientation change means 81 may be provided to the transfer means (4, 5) or to a path from a carry-in entrance to the printing position in the light exposure apparatus 1. The light exposure apparatus 1 is provided with a transfer mechanism that takes in the reticle-carrying container 11 through the carry-in entrance, removes the pod 13 and door 14 of the reticle 12 from the reticle-carrying container 11 in a mid-course, and transfers the reticle 12 to the printing position. On this account, the orientation change means 81 may be provided to the transfer mechanism part of the light exposure apparatus 1. Here, this embodiment is described taking as an example the case where the orientation change means 81 is provided to the transfer means (4, 5).

As shown in FIG. 1, the orientation change means 81 is mainly formed from the rotation drive part 82, the orientation detection means 83, and the control part 84.

The rotation drive part 82 is means for rotating the reticle-carrying container 11. The rotation drive part 82 is provided integrally with the arm part of the transfer mechanism part 5 in such a manner as to rotate and drive the arm part. The rotation drive part 82 is formed from a gear (not shown) attached to the rotatably supported arm part, a drive motor (not shown) for rotating the arm part in engagement with the gear, etc. This allows the rotation drive part 82 to correct the orientation of the reticle-carrying container 11 by rotating and driving the arm part in a state of connecting with the center handling flange 20 of the reticle-carrying container 11.

The orientation detection means 83 is means for detecting the orientation of the reticle-carrying container 11. The orientation detection means 83 is arranged in some position that does not interfere with other devices in the path from the reticle stocker 2 to the light exposure apparatus 1 because it is only required to detect the orientation of the reticle-carrying container 11 while the reticle-carrying container 11 is being transferred from the reticle stocker 2 to the printing position in the light exposure apparatus 1.

The orientation detection means 83 includes various kinds of means for detecting the orientation of the reticle-carrying container 11, electrical means, optical means, mechanical means, etc. The above mentioned wireless tag 74 is employed as the electrical means. A reader (not shown) of the wireless tag is arranged in a position along the transfer rail 4 and opposed to the wireless tag 74 of the reticle-carrying container 11 to be transferred. That is, the reader is arranged in a position where it is possible to react with the wireless tag 74 for information exchange while the reticle-carrying container 11 is being transferred in the correct orientation. The reader has a weak radio wave transmitter 86 with a radio wave arrival distance of a few tens of centimeters and a weak radio wave receiver 87 for receiving a reflected wave, which are arranged in positions opposed to the antenna of the wireless tag 74. The space between the weak radio wave transmitter 86/the weak radio wave receiver 87 and the antenna is set to a few tens of centimeters in agreement with the radio wave arrival distance. In addition, the space between the weak radio wave transmitter 86/the weak radio wave receiver 87 and the antenna is given the property of changing the strength of a reflected wave as the orientation of the reticle-carrying container 11 changes. That is, the space is set in such a manner that the strength of a wave reflected from the antenna varies depending on whether the orientation of the reticle-carrying container 11 is proper or turned by 180 degrees. In this case, the property may be given according to a positional relationship between the weak radio wave transmitter 86/the weak radio wave receiver 87 and the antenna. Alternatively, the property may be given by adding an electromagnetic wave absorber that changes in rate of absorption as the orientation turns by 180 degrees. The antenna may be given directivity so that a reflected wave goes toward the weak radio wave receiver 87 only when the reticle-carrying container 11 is correctly oriented. In addition to the function of detecting the orientation of the reticle-carrying container 11, the weak radio wave receiver 87 also has the function as a reader of reading management information, etc. recorded in the wireless tag 74.

Besides, it is also possible to use the wireless tag 74 only for information management and provide only an antenna for reflecting a radio wave, separately from the wireless tag 74, to the pod 13 or the door 14 of the reticle-carrying container 11. It is also possible to impart directivity to the antenna as described above, adjust the position of the antenna, or add an absorber to the antenna so that differences among radio waves from the antenna may correspond to the orientation of the reticle-carrying container 11.

Pluralities of wireless tags 74 and antennas may be arranged to detect the orientation of the reticle-carrying container 11 in a plurality of reflected wave receiving positions. The antennas may be arranged in an asymmetrical manner to detect the orientation of the reticle-carrying container 11 because a plurality of reflected wave receiving positions are shifted with the change of the orientation of the reticle-carrying container 11.

Moreover, a magnet, magnetic tape or the like may be utilized. By embedding a magnet, magnetic tape or the like in a specific place in the reticle-carrying container 11 and detecting the strength of a static magnetic field of the magnet from a hall element provided corresponding to the position of the magnet, magnetic tape or the like, the orientation of the reticle-carrying container 11 may be detected from a difference in the detected position of the magnet, magnetic tape or the like. A plurality of magnets, magnetic tapes or the like may be arranged. In this case, the plurality of magnets are embedded in different places and thus the detected positions of magnets are varied with the change of the orientation of the reticle-carrying container 11. The orientation of the reticle-carrying container 11 can be detected from a difference in the detected position.

Alternatively, the orientation may be detected by optical means. In this case, the presence or absence of the reticle-carrying container 11 is detected by an optical sensor. At that time, a concavity or hole is provided at an irradiation position of inspection light in the pod 13 or the door 14 when the reticle-carrying container 11 is in the opposite orientation. Accordingly, the optical sensor determines that the reticle-carrying container 11 is correctly oriented when detecting the presence of the reticle-carrying container 11 at the time of passage of the reticle-carrying container 11. If the reticle-carrying container 11 is oppositely oriented, the optical sensor becomes in alignment with the concavity or the like, and thus the inspection light enters the concavity or the like and the optical sensor does not react with the light or detect the presence of the reticle-carrying container 11. Consequently, while the reticle-carrying container 11 passes by, when the optical means detects the presence of the reticle-carrying container 11, it is determined that the orientation is correct, and when the optical means does not detect the presence of the reticle-carrying container 11, it is determined that the orientation is opposite. Additionally, a convexity or the like may be provided instead of the concavity. In this instance, the state in reaction to with the concavity is detected (the state in which the reticle-carrying container 11 is correctly oriented). As the convexity, the one formed in an info pad may be utilized.

Besides those previously mentioned, the orientation of the reticle-carrying container 11 may be also detected in a mechanical manner. For example, a projection may be provided in a place not interfering with the surroundings in the pod 13 or the door 14 so that the orientation of the reticle-carrying container 11 is detected depending on whether or not the receiving part provided in the transfer device is in contact with the projection at the time of passage of the reticle-carrying container 11.

The control part 84 determines whether the orientation detected by the orientation detection means 83 is correct or not and, if the orientation is shifted by 180 degrees, control the rotation drive part 82 to rotate the reticle-carrying container 11 to the correct orientation. The control part 84 may be incorporated as part of the control device for controlling the overall reticle-processing system or may be provided as an independent device.

The reticle-processing system configured in this manner is used as described below. Here, the description is given taking as an example a case where the reticle-processing system is used for printing a circuit pattern on the semiconductor wafer.

Firstly, the reticle 12 is stored in the reticle-carrying container 11. At that time, the reticle 12 is placed on the reticle retainer 45 on the side of the door 14, and then the pod 13 is mounted and fixed with the fasteners 41. This allows the reticle 12 to be supported between the reticle retainer 45 of the door 14 and the reticle retainer 25 on the side of the pod 13. More specifically, the retainer plate 51 of the reticle retainer 45 and the retainer plate 27 of the reticle retainer 25 contact obliquely and support the lower corner 12B of the reticle 12 and the upper corner 12A of the reticle 12, respectively. At that time, concave portions 52 and 31 inside the retainer plates 51 and 27 allow the deformation of the retainer plates 51 and 27, thereby supporting the reticle 12 elastically. This allows the reticle 12 to be restrained in all the degrees of freedom and fixed within the reticle-carrying container 11, without suffering any damage on its surface.

If the reticle 12 is provided with the pellicle 46, the pellicle 46 is fixed with the pellicle retainer 47 in the same way as the case of the reticle 12.

In this manner, the reticles 12 are stored one by one in the reticle-carrying containers 11. The operator stacks a required number of the reticle-carrying containers 11 in the reticle stocker 2. At that time, it is preferable to align all the reticle-carrying containers 11 in the predetermined orientation. However, even if any of the reticle-carrying containers 11 is wrongly oriented, it can be fastened without problems by the two pairs of kinematic pin grooves 61.

All the subsequent operations in relation to the reticle-carrying container 11, such as transportation, are performed in a mechanical fashion. More specifically, all the operations including taking the reticle-carrying container 11 out of the reticle stocker 2, putting the reticle-carrying container 11 into storage, moving the reticle-carrying container 11 on the transfer rail by means of the transfer crane, and setting the reticle 12 from the reticle-carrying container 11 to the light exposure apparatus 1, are mechanically carried out (SMIF: Standard Mechanical Interface).

The arm part of the transfer mechanism part 5 on the transfer rail 4 engages with the center handling flange 20 of the reticle-carrying container 11 in the reticle stocker 2 to lift the reticle-carrying container 11. Then, the reticle-carrying container 11 is moved on the transfer rail 4 to the light exposure apparatus 1.

In the transfer process, the orientation of the reticle-carrying container 11 is corrected. More specifically, the weak radio wave transmitter 86 of the orientation detection means 83 transmits a weak radio wave to the wireless tag 74. Accordingly, the wireless tag 74 transmits a reflected light, the weak radio wave receiver 87 detects the reflected wave, and the control part 84 determines whether the reticle-carrying container 11 is in the correct orientation or not according to the signal power. If the orientation is shifted by 180 degrees, the rotation drive part 82 is controlled to rotate the arm part of the transfer mechanism 5 and correct properly the orientation of the reticle-carrying container 11.

When transferred to the light exposure apparatus 1, the reticle-carrying container 11 is put in a predetermined position within the light exposure apparatus 1, and then the kinematic pins (not shown) of the light exposure apparatus 1 are engaged in the kinematic pin grooves 61. Then, the fasteners 41 of the reticle-carrying container 11 are mechanically released, the side handling flange 21 is caught by the arm (not shown) of the opening/closing mechanism, and the pod 13 is separated from the door 14. Next, the door 14 is moved down and the reticle 12 is introduced into the light exposure apparatus 1. After that, the reticle 12 is moved toward the automatic exposure stage (not shown) of the light exposure apparatus 1, positioned accurately in a predetermined position on the already set semiconductor wafer, and light-exposed in an automatic manner.

Upon completion of the light exposure, the reticle 12 is returned to the door 14 of the reticle-carrying container 11, and aligned with the pod 13 by elevating the door 14, and fixed with the fasteners 41. At that time, an upper corner 12A and a lower corner 12B of the reticle 12 are supported between the reticle retainers 25 and 45, and the reticle 12 is restrained in all the degrees of freedom and fixed within the reticle-carrying container 11 without suffering any damage on its surface, as described above. Then, the kinematic pins are separated from the kinematic pin grooves 61, the reticle 12 is moved on the transfer rail 4 and returned to the reticle stocker 2 by the transfer mechanism 5.

These operation processes are controlled on the basis of the information recorded in the wireless tag 74. The wireless tag 74 on the door 14 of the reticle-carrying container 11 stores various types of information including the kind of the reticle 12 and the operation histories. The reader reads the information from the wireless tag 74 in a non-contact manner and the light exposure apparatus 1 exercises control according to the information. After completion of the light exposure, if required, the light exposure apparatus 1 uses the writer (not shown) to write the history records and operation records of the reticle 12 and the reticle-carrying container 11 into the wireless tag 74. This allows exposure and management operations to be smoothly carried out.

Since the wireless tag 74 is hermetically sealed by the covering plate 75, it is possible to prevent the wireless tag 74 from falling off and suffering mechanical damage and to avoid the contamination of the light exposure apparatus with the wireless tag 74 itself.

Suppose that the reticle-carrying container 11 is located in an environment with changes in atmospheric pressure. For example, if the reticle-carrying container 11 is placed under a relatively low atmospheric pressure in the sky, as in the case of air transport, or placed under a relatively high atmospheric pressure on the ground, a pressure in the reticle-carrying container 11 may be lower than the outside pressure. In this case, it is difficult to separate the pod 13 from the door 14. On this account, the membrane filter 63 allows the passage of a gas between the inside and outside of the reticle-carrying container 11, which prevents a pressure in the reticle-carrying container 11 from being higher than an external pressure. This makes it easy to separate the pod 13 from the door 14.

In addition, in changing the gases in the reticle-carrying container 11, a gas supply tube is inserted into and connected with the tube guide 65 of the membrane attachment part 62 to send an inert gas or dry air to the tube guide 65.

As stated above, while the reticle-carrying container 11 moves from the reticle stocker 2 to the printing position in the light exposure apparatus 1, the orientation change means 81 detects the orientation of the reticle-carrying container 11 and corrects the orientation appropriately. That is, if the detection of the orientation detection means 83 has revealed that the orientation is shifted by 180 degrees, the rotation drive part 82 controlled by the control part 84 rotates the reticle-carrying container 11 so as to be correctly oriented.

As the result, even if the orientation of the reticle-carrying container 11 is shifted by 180 degrees, it is possible to automatically correct the orientation of the reticle-carrying container 11 without stopping the reticle-processing system, thereby improving working efficiency in the operation process.

Two pairs of kinematic pin grooves 61 are arranged with the 180-degree shift from each other, and thus even if the reticle-carrying container 11 is placed in the wrong orientation, the reticle is correctly set in the light exposure apparatus 1 at any time without any problem.

Moreover, the receiving parts 22 are provided to the main part 17 of the pod 13 in the six positions according to the kinematic pin grooves 61, which makes it possible to stack a plurality of reticle-carrying containers 11 without any concern about their orientations. It is acceptable that at least four receiving parts engage with the kinematic pin grooves in a symmetrical manner, and thus the receiving parts are not necessarily required in six places.

Besides, this allows the reticle 12, etc. to be supported safely and securely without any damage from the reticle retainer 25, etc., making it possible to treat the reticle 12, etc. more carefully.

Additionally, varied types of information are recorded and managed in the wireless tag 74, which makes it possible to increase operating efficiency based on the information. The wireless tag 74 is hermetically sealed by the covering plate 75, and thus it is possible to prevent the wireless tag 74 from falling off and suffering mechanical damage and to avoid the light exposure apparatus from contaminated with the wireless tag 74 itself.

Moreover, the membrane filter 63 allows the passage of a gas between the inside and outside of the reticle-carrying container 11, which prevents a pressure in the reticle-carrying container 11 from becoming higher than an external pressure. This makes it easy to separate the pod 13 from the door 14. In addition, this also makes it easy to change the gases in the reticle-carrying container 11.

The control part 84 as means for changing appropriately the orientation of the reticle-carrying container 11, if having determined that the orientation detected by the orientation detection means 83 is shifted by 180 degrees, controls the rotation drive part 82 to rotate the reticle-carrying container 11 so as to be correctly oriented. Thus, it is possible to correct the orientation of the reticle-carrying container 11 in a non-contact manner without stopping the transfer of the reticle-carrying container 11, thereby raising the working efficiency in the operation process.

The orientation detection means 83 includes the wireless tag 74 or the optical sensor for detecting the orientation of the reticle-carrying container 11 in a non-contact manner, and thus detects the orientation of the reticle-carrying container 11 in a non-contact manner without stopping the transfer of the reticle-carrying container and rotates the reticle-carrying container 11 for the proper orientation. This brings about the increased working efficiency in the operation process.

The means for changing appropriately the orientation of the reticle-carrying container 11 is arranged in the transfer means (4, 5) or the light exposure apparatus 1 to determine whether the reticle-carrying container 11 is in the proper orientation or not and correct the orientation if it is wrong. This makes it possible to improve the working efficiency in the process of operations.

Two pairs of kinematic pin grooves 61 with a 180-degree turn from each other are provided to the outer surface of the door of the reticle-carrying container 11 so that, the reticle-carrying container 11, even if it is placed in the wrong orientation, can be fastened as it is. This eliminates the need for exercising extra care about the orientation of the reticle-carrying container 11, thereby improving the working efficiency in the operation process.

The receiving parts 22 are arranged in such a manner that the two pairs of kinematic pin grooves 61 can engage with the pins in the both orientations, which makes it possible to stack a plurality of reticle-carrying containers 11 without having to be excessively careful about their orientations. This achieves an increase in the efficiency of setting the reticle-carrying containers 11.

In the above mentioned embodiment, the membrane filter 63 is provided on the side of the pod 13. Alternatively, this may be provided on the side of the door 14. In addition, the number of the membrane filter 63 is not limited to one and may be two or more. One or a plurality of the membrane filters 63 may be provided to either the pod 13 or the door 14 or both. In this case, the membrane filters 63 must be installed in positions that do not interfere with the other components.

Furthermore, in the above stated embodiment, one wireless tag 74 is attached to the outer surface of the door 14. Alternatively, as required, two or more wireless tags may be provided. Also, the position of the attachment is not limited to the door 14 and may be the pod 13 or both. Depending on the required function or the relationship between the reader and the writer, the wireless tag 74 may be attached to the side of the pod 13. In addition, the information to be recorded in the wireless tag 74 is not limited to operation histories and may be other various kinds of information.

What is claimed is:

1. A reticle-processing system comprising:
   a reticle-carrying container for storing a reticle;
   transfer means for transferring the reticle-carrying container;
   a light exposure apparatus for printing a circuit pattern onto a photoresist on a semiconductor wafer through a use of the reticle;
   a reticle stocker for keeping a plurality of the reticles; and
   orientation means for detecting an orientation of the reticle-carrying container and for changing the orientation of the reticle-carrying container, in a path from the reticle stocker to a printing position in the light exposure apparatus, the orientation means comprising:
   a rotary drive for rotating the reticle-carrying container;
   a radio transmitter for transmitting radio waves;
   a wireless tag, on the reticle-carrying container, for receiving and reflecting the transmitted radio waves; and
   a controller for receiving the reflected radio waves and for, on the basis of the received reflected radio waves determining whether or not the orientation of the contained is proper and for, when the orientation is rotated 180 degrees, controlling the rotary drive so as to rotate the reticle-carrying container to a proper orientation.

2. The reticle processing system according to claim 1 wherein the wireless tag incorporates an antenna.

3. The reticle-processing system according to claim 1, wherein the orientation means is incorporated into the transfer means.

4. The reticle-processing system according to claim 1, wherein the orientation means is incorporated into the light exposure apparatus.

5. The reticle-processing system according to claim 1, wherein two pairs of kinematic pin grooves for positioning and fastening the reticle-carrying container in the light exposure apparatus are located at a 180-degree turn from each other on an outer surface of a door of the reticle-carrying container.

6. The reticle-processing system according to claim 5, wherein
   receiving parts for receiving and holding the kinematic pin grooves are arranged in positions corresponding to the kinematic pin grooves on the outer surface of a pod of the reticle-carrying container, so that the two pairs of kinematic pin grooves can be engaged in both orientations.

* * * * *